(12) United States Patent
Ohtsu et al.

(10) Patent No.: US 6,783,811 B2
(45) Date of Patent: *Aug. 31, 2004

(54) METHOD OF REDUCING RESISTANCE FOR CONDUCTIVE FILM FORMED ON BASE MATERIAL

(75) Inventors: Shigemi Ohtsu, Nakai-machi (JP); Eiichi Akutsu, Nakai-machi (JP)

(73) Assignee: Fuji Xerox Co., Ltd., Tokyo (JP)

( * ) Notice: Subject to any disclaimer, the term of this patent is extended or adjusted under 35 U.S.C. 154(b) by 285 days.

This patent is subject to a terminal disclaimer.

(21) Appl. No.: 10/013,371

(22) Filed: Dec. 13, 2001

(65) Prior Publication Data

US 2003/0003303 A1 Jan. 2, 2003

(30) Foreign Application Priority Data

Jun. 28, 2001 (JP) .................................... 2001-196560

(51) Int. Cl.⁷ .................. B05D 3/06; H01L 21/203; H01L 21/205
(52) U.S. Cl. .................. 427/558; 427/559; 427/586; 427/350; 427/372.2; 438/308; 438/486; 438/487; 438/795; 438/798
(58) Field of Search .................. 427/558, 559, 427/586, 350, 372.2, 109, 126.3, 160, 294; 438/487, 486, 308, 795, 798; 428/412

(56) References Cited

U.S. PATENT DOCUMENTS 6,236,061 B1 * 5/2001 Walpita .................. 257/40
2002/0132454 A1 * 9/2002 Ohtsu et al. .................. 438/486

FOREIGN PATENT DOCUMENTS

| JP | A 5-315361 | 11/1993 |
| JP | A 5-326402 | 12/1993 |
| JP | A 6-11738 | 1/1997 |
| JP | A 11-302017 | 11/1999 |

OTHER PUBLICATIONS

Copending Application 10/013,390.*

* cited by examiner

Primary Examiner—James J. Seidleck
Assistant Examiner—Thao T. Tran
(74) Attorney, Agent, or Firm—Oliff & Berridge, PLC

(57) ABSTRACT

A method of reducing resistance for a conductive film based on simple process at low temperatures, particularly a method of reducing resistance for a conductive film formed on a base of plastic resins is provided. A method of reducing resistance for a conductive film formed on a base material includes a treating process, in which a conductive film made of metal oxide is formed on a base material and irradiated with UV light in vacuum or in an atmosphere of reducing gas maintaining the temperature between 25° C. and 300° C.

14 Claims, 1 Drawing Sheet

ATMOSPHERIC GAS →

METHOD OF REDUCING RESISTANCE FOR CONDUCTIVE FILM FORMED ON BASE MATERIAL

BACKGROUND OF THE INVENTION

1. Field of the Invention

The present invention relates to a method of reducing resistance for a conductive film formed on a base material, more particularly it relates to a method of reducing resistance for a conductive film formed on a plastic base material.

2. Description of the Related Art

The conductive film such as ITO is increasing its demand in various application fields such as transparent electrodes in liquid crystal display elements, plasma-emission display elements, solar cells, or optical devices.

In order to build up a conductive film on a base material, usually amorphous metal oxide or crystalline metal oxide is formed on a base material heating the base material at above 200° C. by means of electron beam deposition method (EB method), sputtering method, or ion-plating method. When the heating process of the base material is omitted, the film formation is generally feasible only for amorphous metal oxides that usually exhibit high resistance figures, yielding films of high resistance. Heating a base plate above 200° C. accelerates crystallization of the oxide yielding polycrystalline metal oxide film. In general, polycrystalline metal oxides yield films of lower resistance than those of amorphous oxides.

Adoption of the method for formation of a polycrystalline conductive film having low resistance on a plastic base material is difficult in view of the heat resistant property of present plastic base materials. Thus it is not still implemented except for a few base plates made from highly heat resistant plastic base plates.

ITO is widely applied for an electro-conductive film of excellent transparency. Its light absorption, however, is not negligible depending on its use. Generally the light absorption is influenced greatly by the film thickness: it increases as the thickness increases. On the other hand, a thinner film brings about a larger electric resistance value although the light absorption decreases. Therefore, a new electro-conductive film is hoped for, which realizes negligible light absorption together with very small electric resistance. Such ITO films are not yet materialized at present. The requirement is still difficult to meet since the heat resistance of an ordinary plastic base material is low (223° C. at most) at preparing an electro-conductive film on a surface of a plastic base material.

In contrast, a new electro-conductive film replacing ITO is described in Japanese Published Unexamined Patent Application No. Hei 11-302017, which is characterized by a complex metal oxide containing indium (In), antimony (Sb), and oxygen (O). This boasts low electric resistance, high transparency in the visible light region, and less content of expensive In. The complex metal oxide has a defected fluorite structure having a general formula $In_3Sb_{1-x}O_{7-\delta}$ (where $-0.2 \leq X \leq 0.2$ and $-0.5 \leq \delta \leq 0.5$), and the transparent film is manufactured by sputtering the above complex metal oxide as a target material. This method is characterized by execution of sputtering on a base plate at a high temperature of 500° C., which yields a crystalline film. Naturally this cannot be applied to the formation of electro-conductive film on a plastic base material.

The above patent publication also describes a process of producing oxygen vacancies by reductive annealing of the obtained crystalline film for 0.1 to 10 hours at a temperature between 100° C. and 1,300° C., which enables injection of carrier electrons evolved by the charge compensation into the vacancies. Note that the annealing means annealing a crystalline film, not converting an amorphous film into a crystalline film.

With regard to the production of crystalline film by applying heat on an amorphous film formed on the surface of a plastic resin base, methods of forming a semiconductor film on a plastic resin base have been reported. For example, Japanese Published Unexamined Patent Application No. Hei 06-11738 describes a method of producing crystalline semiconductor film of silicon for an MIM apparatus. In the patent, a film surface made of insulating silicone base-compound is irradiated with an energy beam like laser beam inducing meltdown of the surface and converting the surface layer into a crystalline silicon film, still leaving the under layer as the insulating silicon base-layer. Also Japanese Published Unexamined Patent Application No. Hei 05-315361 describes the formation of a semiconductor film on a plastic film, in which a layer of non-crystalline material and a layer of insulating metal oxide are formed on a plastic film in this order, followed by application of laser beam on the side of an insulating oxide layer. The result is meltdown of the layer of non-crystalline material partly at a section close to an interface between the layer of non-crystalline material and the layer of insulating metal oxide. This does not give thermal damage by the laser beam on the plastic film and allows successful production of crystalline semiconductor film. Further, Japanese Published Unexamined Patent Application No. Hei 05-326402 reports a similar production method of multi-crystalline silicon layer on a plastic film. In the patent, a heat barrier layer is first formed on a plastic film in order to cancel the thermal effect of laser beam. Then a layer of amorphous silicon is formed on the barrier layer, followed by application of laser beam for converting the layer into amorphous silicon.

All these methods depend on the annealing process of an amorphous semiconductor film by laser beam for crystallization. They bring about meltdown of only the surface of amorphous semiconductor layer for avoiding thermal effects by laser beam (the temperature sometimes reaches 1,000° C.) for crystallization, or in creating a heat barrier layer. Therefore, these methods are incapable of crystallizing a whole amorphous film, and require other processes such as creating a heat barrier layer as well as an expensive laser beam irradiation apparatus. In addition, it becomes necessary to scan the focus of laser beam all over the film surface, leading to difficulties in large size processing of the film. There is also a disadvantage of needing a long time for its complete crystallization.

SUMMARY OF THE INVENTION

The present invention has been contrived in view of the abovecircumstances. The present invention provides a method of reducing resistance of a conductive film at low temperatures depending on simple processes, more particularly a method of reducing resistance of a conductive film formed on a plastic base material. The method may be a method of reducing resistance for a conductive film made of metal oxide formed on a base material, which includes a UV light irradiation process on the film in vacuum or in an atmosphere of reducing gas at a temperature maintained between 25° C. and 300° C.

The conductive film made of metal oxide may be a conductive film including amorphous metal oxide.

The atmosphere of reducing gas may be an atmosphere of reducing gas containing hydrogen.

The metal oxide may be indium oxide or oxides of other metals containing indium oxide.

The metal oxide may be tin oxide or oxide of other metals containing tin oxide.

The metal oxide may be oxide of other metals containing both indium oxide and tin oxide.

The metal oxide may be zinc oxide or oxide of other metals containing zinc oxide.

The UV light may be emitted from an excimer lamp.

The maintained ranges of the temperature may be between 50° C. and 250° C.

The base material may be made up of a plastic base material and the abovementioned maintained ranges between 50° C. and a heat resistant temperature of the plastic base material.

The heat resistant temperature of the abovementioned plastic base material may ranges between 100° C. and 230° C.

The conductive film including amorphous metal oxide may be formed by a sputtering method.

The conductive film including amorphous metal oxide may be formed by an electron beam deposition method.

The conductive film including amorphous metal oxide may be formed by an ion plating method.

A laminated material may be provided according to the present invention, which comprising a plastic base and crystalline metal oxide containing indium oxide and tin oxide that is formed and treated for reducing resistance on the plastic base. The oxide surface of the laminated sheet may have a sheet resistance ranges between 50 $\Omega/\square$ and 10-$\Omega/\square$.

The crystalline metal oxide containing indium oxide and tin oxide may exhibit definite peaks in X-ray crystallography.

A substrate for a device may also be provided according to the present invention, which including a laminated material that contains a plastic base and crystalline metal oxide containing indium oxide and tin oxide that is formed and treated for reducing resistance on the plastic base.

BRIEF DESCRIPTION OF THE DRAWING

Preferred embodiments of the present invention will be described in detail based on the followings, wherein.

DETAILED DESCRIPTION OF PREFERRED EMBODIMENTS

Figure 1:
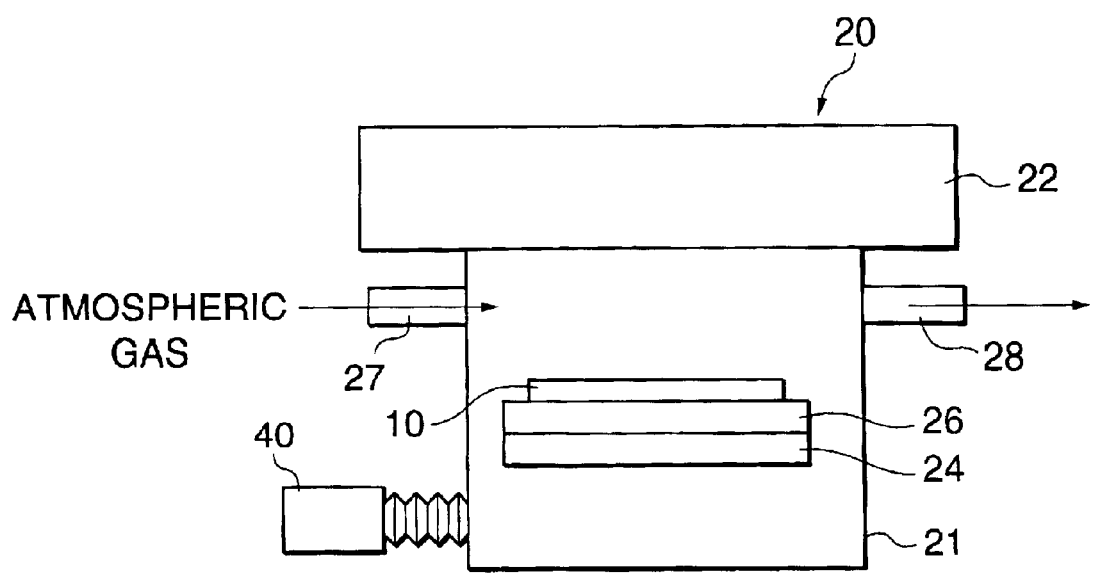
FIG. 1 is a schematic diagram for an example of an annealing apparatus employed in the present invention.

The present invention relates to a method of reducing resistance for a conductive film made of metal oxide formed on a base material by applying a UV light irradiation process on the film in vacuum or in an atmosphere of gas at a temperature maintained between 25° C. (room temperature) and 300° C. This invention is based on a discovery that the conductive film made of metal oxide increases its crystallizing property and reduces its resistance under irradiation of UV light even at low temperatures.

In the resistance reducing method according to the present invention for a conductive film, the heating temperature can be set to figures far lower than in a conventional method in which high temperatures are needed for heating a base material at the formation of an electro-conductive film. In addition, only a conventional UV light irradiation apparatus is needed in place of a laser beam irradiation apparatus for application of UV light on the whole surface of an electro-conductive film. Therefore, the method according to the present invention can be handled with shorter process time and smaller equipment, and the obtained conductive film exhibits lower resistance at a certain thickness than the conventional products. As a result, the product is a conductive film with very small light absorption.

The abovementioned method allows employment of base material made of plastic base materials, as the heating temperature can be set to very low compared to the existing method. In all, it has been achieved by the present invention for the first time to form a conductive film, which is formed on a plastic base materials and exhibits low resistance and small light absorption simultaneously. In the existing method, it was difficult to produce a conductive film formed on a plastic base material, which shows such excellent performance, depending on a simple production method.

Concerning the base material used for the present invention, limitlessly employed are glass bases; base materials made of plastic base materials in the form of films, sheets, or plates; ceramic base materials such as ceramic sheets and ceramic plates; and mono-crystalline base materials made of Si, GaN, GaAs, or GaP. As the bases f plastic base materials, listed are films, sheets, or plates of polyethylene terephthalate, polyethylene naphthalate, polyether-ketone, polysulfone, polyether-imide, polyphenylene-sulfide, polyarylate, polyimide, polycarbonate, and norbornene resin (trade name; ARTON by JSR). Among these resins norbornene resin is a recent focus of attention as an excellent heat resistant resin having superior transmissivity of light in a wide range of spectrum (Chemical Business Journal, December 1997 extra edition). These plastic base materials should preferably have a flexible character.

As is described in detail in the following section, within the range of heating temperature adopted in the present invention, that is from 25° C. to 300° C., higher temperatures afford better efficiencies for reducing resistance of a conductive film made of metal oxide. When plastic materials are used for the base material, therefore, adoption of highly heat resistant plastic materials is preferable. With regard to typical heat resistant plastic, polyimide is cited. When transparency is required for the base material, polycarbonate (PC: heat resistant temperature of 205° C.), polyether-sulfone (PES: heat resistant temperature of 223° C.), polysulfone (PS: heat resistant temperature of 190° C.) and ARTON (heat resistant temperature of 171° C.) are favorably employed. In view of the heat resistance, PES is the most preferable, and in view of the transparency, PC is the most preferable substance.

In the present invention the heat resistant temperature for a plastic base material is a glass transition point, which is 100° C. to 230° C.

In the present invention, conductive materials made of inorganic matters are employed. Examples include $SnO_2$ with Sb, Zn, their oxides or F; $In_2O_3$ with Sb, Zn, Sn, Si, Ge, their oxides or F; ZnO added of Al, Ga, In, Ge, or their oxides; $InGaO_2$, $MgIn_2O_4$, CdO, $CdSnO_4$, $CdGaO_4$, and $Cd_2SnO_4$. Classifying the abovementioned conductive films made of metal oxide based on their crystalline state, there are amorphous substances, substances of low crystallinity with an amorphous portion, etc.

Concerning the formation method for conductive film of metal oxide, employed are the sputtering method, the RF sputtering method, the EB deposition method, and the ion plating method.

In the case of forming the above conductive film of metal oxide on a plastic base material, it is possible to carry out the film formation at rather low temperatures, that is, below the heat resistant temperature of many plastics which are known to exhibit good transparency. Among the listed methods, the sputtering method is preferred as it causes least damage on the base material.

In the present invention, the temperature to be maintained at heating the conductive film of metal oxide is, depending on the duration of heating, above 25° C., preferably above 50° C. This suffices to induce low resistance in the above-mentioned electro-conductive film. Since the resistance figures of the conductive film of metal oxide becomes lower as the crystallinity of the film becomes higher, higher heating temperatures are favored for improving the crystallinity. From this viewpoint, there are no limitations in the upper limit of heating temperature. But considering selection of a heating method, control of heating temperature, and resulting energy loss, the temperature should be approximately 300° C., preferably about 250° C. From the viewpoint of efficient resistance reduction and optimum selection of the heating conditions, the conductive film of metal oxide is preferably heated in the range of 100° C. to 200° C.

When plastic base materials are selected for the base material, the upper limit of heating temperature becomes equal to the heat resistant temperature of the plastic base materials. It is approximately 230° C. at most for the above-listed plastic base materials. From the above two view points, it is preferred that the base material of plastic resins is heated in the range between 100° C. and 200° C. (when the heat resistant temperature of the employed plastic resin is below 200° C., the upper limit is its heat resistant temperature).

Application of UV light can be satisfactorily performed with commercially available UV light irradiation apparatus. Among them the excimer lamp is preferably employed. As the shorter wavelength of UV light has the higher energy, the wavelength below 365 nm, preferably below 308 nm, is employed in the present invention (for example, UV light of 308 nm, 202 nm, and 172 nm).

An irradiation amount of 1–50 mW/cm$^2$ is sufficient for reducing resistance of a conductive film made of metal oxide. The longer the irradiation time of UV light is prolonged, the lower the resistance of conductive film made of metal oxide is converted. For example, a heating time of 10 to 30 minutes is adequate for heating ITO at 150° C., although the condition varies depending on the species of the conductive film made of metal oxide or the heating time.

As for the atmosphere in which the heating and the UV light irradiation are performed, vacuum or atmosphere of gas is preferred, more particularly an atmosphere having low partial pressure of oxygen is favored. Lower partial pressures of oxygen helps to lower the heating temperature of conductive film made of metal oxide. In the invention, the "vacuum" is generally defined as a degree of vacuum below approximately $10^{-2}$ Pa. It can be determined properly depending on other conditions. With regard to the atmosphere of gases, one or more species selected from a group made up of hydrogen gas, nitrogen gas, ammonia gas, rare gases such as He, Ne, or Ar, or carbon monoxide gas are preferably used. Particularly the reducing atmosphere containing hydrogen gas is preferred.

In an example the annealing process is conducted under a reducing atmosphere of purified nitrogen gas with 2 to 5% (less than the explosion limit) hydrogen gas (with a flow rate of 0.5 to 2 L/min on a 1-liter apparatus). The treated conductive film made of metal oxide shows resistance reduced in accordance with the progress of crystallization. While in the process lattice defects are generated increasing the concentration of electron carriers, which also induces reduction of resistance for a conductive film made of metal oxide. The pressure of reducing atmosphere may be the ordinary pressure (atmospheric pressure) or a reduced pressure.

Next, an explanation will be given on the annealing apparatus employed in the present invention. FIG. 1 shows a schematic diagram for an example of annealing apparatus that performs resistance reduction under an atmosphere of gas. Here an annealing apparatus 20 is equipped with a chamber 21 that contains a base material coated of a conductive film made of metal oxide (may be called simply "base" hereinafter), a UV light irradiation unit 22, a heating unit 24, a heat conducting plate 26 that conveys heat from the heating unit, a unit for introducing and excluding atmospheric gas that is not shown in the figure, a path 27 for introducing atmospheric gas, a path 28 for excluding atmospheric gas, and a vacuum evacuation unit 40. The number 10 denotes a base plate made of base material coated with a conductive film made of metal oxide. Between the base plate 10 and the heat conducting plate 26, a temperature sensing unit is provided, though not shown in the figure, and controls the temperature of the base plate (that is the temperature of a conductive film made of metal oxide) based on a temperature controlling unit, which is not shown in the figure. When using the annealing apparatus, the partial pressure of oxygen within the chamber is to be lowered. It is also possible to lower the partial pressure of oxygen by making a reducing gas flow in for a certain period instead of employing a vacuum evacuation unit. In this case the vacuum evacuation unit can be omitted. Concerning UV light irradiation unit, an excimer lamp is preferred. An electric heater is preferred for the heating unit, and a heat conducting ceramic plate, for example, may be employed for the heat conducting plate. A thermocouple, for example, may be used for the temperature sensing unit, and a turbo molecular pump may be used for evacuating gas within the apparatus by vacuum.

When the method of reducing resistance according to the present invention is conducted in vacuum, the unit for introducing and excluding atmospheric gas in the annealing apparatus, as is illustrated in FIG. 1, may be replaced with a vacuum evacuation unit for excluding gas within the apparatus. An example of the unit is a turbo molecular pump.

The method of reducing resistance described in the present invention affords a low temperature annealing process, and thus makes heating unit or temperature controlling unit of special specification unnecessary. An inexpensive unit may be used for the purpose to a large merit.

According to the present invention, a laminated material is successfully obtained, in which crystalline metal oxide containing indium and tin is processed for reduced resistance and coated on a base of plastic resins. The sheet resistance on the oxide surface of the laminated material is preferably in the range of 10 to 50Ω/□. This laminated material is applicable to a base plate of electronics device, for example, a base plate with a shared electrode, which is produced forming a homogeneous electro-conductive film on a transparent base made of plastic. It may also be applied to a base plate of electronics device like an electrode-driving base plate, in which an electro-conductive film with patterning or wiring is formed on a plastic base.

EXAMPLES

While the illustrative embodiments of the invention have been described with particularity, it is not intended that the scope of the claims appended hereto be limited to the examples and descriptions set forth herein.

Example 1

A 0.7-mm-thick non-alkaline glass plate (Corning No. 1737) was maintained at 150° C., on which ITO film was formed with a thickness of 100 nm by the sputtering method. The processed glass plate was maintained at the temperature of 150° C. in an experiment apparatus (about 1 liter in volume) shown in FIG. 1, which had been removed of oxygen by vacuuming ($10^{-2}$ Pa) and filled with highly purified nitrogen gas with 3% hydrogen (Flow rate: 1 L/min under the atmospheric pressure). Then UV light (wavelength: 172 nm, Intensity: 10 mW/cm$^2$) was applied on the glass plate for 10 minutes using an excimer lamp (product of USHIO ELECTRIC INC.).

The obtained film was tested on an X-ray diffractometer before and after the annealing treatment. Before annealing X-ray diffraction peaks were not observed indicating that the product was in the form of amorphous ITO. After annealing, X-ray diffraction peaks appeared at 2θ=30.34 (d=2.9436 Å) and 2θ=35.26 (d=2.5434 Å) confirming that crystallization had progressed. While the resistance of the ITO film was 50Ω/□ before annealing, the resistance figure dropped drastically to 20Ω/□ after annealing.

These results proved that the resistance of the amorphous ITO film was decreased due to crystallization by the above annealing treatment.

Example 2

The example 1 was repeated except that a 0.15 mm thick plastic sheet (PES film, product of SUMITOMO BAKELITE) was employed as the base material, and the annealing temperature was changed to 130° C.

The formed ITO film on a plastic sheet was analyzed for X-ray diffraction intensity, and diffraction peaks were observed at 2θ=30.34 (d=2.9436 Å) and 2θ=35.26 (d=2.5434 Å). While the resistance of the ITO film was 60 Ω/□ before annealing, the resistance figure dropped to 25 Ω/□ after annealing.

These results proved that the resistance of amorphous ITO film decreased due to crystallization by the above annealing treatment.

Example 3

The example 2 was repeated for producing a conductive film made of metal oxide except that the annealing temperature was set to 180° C. and the annealing time was changed to 5 minutes. While the resistance of the ITO film was 60Ω/□ before annealing, the resistance figure dropped to 25Ω/□ after annealing.

Example 4

The example 2 was repeated for producing a conductive film made of metal oxide except that the annealing temperature was set to 50° C. and the annealing time was changed to 120 minutes. While the resistance of the ITO film was 60Ω/□ before annealing, the resistance figure dropped to 30Ω/□ after annealing.

Example 5

The example 1 was repeated for forming ITO film on a plastic sheet except that a 0.188-mm-thick plastic sheet (ARTON film produced by JSR) was employed and the annealing temperature was changed to 130° C.

The annealed film was tested on an X-ray diffractometer. In the obtained film, X-ray diffraction peaks appeared at 2θ=30.34 (d=2.9436 Å) and 2θ=35.26 (d=2.5434 Å) While the resistance of the ITO film was 60 Ω/□ before annealing, the resistance figure dropped to 25 Ω/□ after annealing.

These results proved that the resistance of the obtained amorphous ITO film was decreased due to crystallization by the above annealing treatment.

Example 6

The example 5 was repeated for producing a conductive film made of metal oxide except that the annealing temperature was set to 150° C. and the annealing time was changed to 10 minutes. While the resistance of the ITO film was 60 Ω/□ before annealing, the resistance figure dropped to 30 Ω/□ after annealing.

The method of reducing resistance for a conductive film made of metal oxide according to the present invention allows a very low temperature for heating the base material compared with the existing methods which require high temperatures for heating at formation of an electro-conductive film. Application of UV light on the whole surface of the film is feasible with an ordinary UV light irradiation apparatus, and a laser beam irradiation apparatus is not needed. Therefore, the invention can be executed within a shorter time than the existing methods, dispensing with a large-scale treatment apparatus. The obtained conductive film made of metal oxide exhibits low resistance figures on rather thin films, providing an electro-conductive film having low resistance and small light absorption as the result.

As the heating temperature can be set low, plastic sheets can be used as the base material. Thus formation of a conductive film made of metal oxide that has low resistance and small light absorption simultaneously on a base of plastic resins has been achieved for the first time by the present invention.

The entire disclosure of Japanese Patent Application No. 2001-196560 filed on Jun. 28, 2001 including specification, claims, drawings and abstract is incorporated herein by reference in its entirety.

What is claimed is:

1. A method of reducing resistance for a conductive film made of metal oxide formed on a base material, comprising irradiating the film with UV light in a vacuum or in an atmosphere of reducing gas at a temperature maintained between 25° C. and 300° C.

2. A method of reducing resistance for a conductive film made of metal oxide formed on a base material according to claim 1, wherein the conductive film comprises amorphous metal oxide.

3. A method of reducing resistance for a conductive film formed on a base material according to claim 1, wherein the atmosphere of reducing gas is an atmosphere of reducing gas containing hydrogen.

4. A method of reducing resistance for a conductive film formed on a base material according to claim 1, wherein the metal oxide is indium oxide or oxides of other metals containing indium oxide.

5. A method of reducing resistance for a conductive film formed on a base material according to claim 1, wherein the metal oxide is tin oxide or oxides of other metals containing tin oxide.

6. A method of reducing resistance for a conductive film formed on a base material according to claim 1, wherein the metal oxide is oxides of other metals containing both indium oxide and tin oxide.

7. A method of reducing resistance for a conductive film formed on a base material according to claim 1, wherein the metal oxide is zinc oxide or oxides of other metals containing zinc oxide.

8. A method of reducing resistance for a conductive film formed on a base material according to claim 1, wherein the UV light is emitted from an excimer lamp.

9. A method of reducing resistance for a conductive film formed on a base material according to claim 1, wherein the maintained temperature ranges between 50° C. and 250° C.

10. A method of reducing resistance for a conductive film formed on a base material according to claim 1, wherein the base material is comprised of a plastic base material and the maintained temperature ranges between 50° C. and a heat resistant temperature of the plastic base material.

11. A method of reducing resistance for a conductive film formed on a base material according to claim 1, wherein the base material comprises plastic and has a heat resistant temperature ranging between 100° C. and 230° C.

12. A method of reducing resistance for a conductive film formed on a base material according to claim 2, wherein the conductive film comprising amorphous metal oxide is formed by a sputtering method.

13. A method of reducing resistance for a conductive film formed on a base material according to claim 2, wherein the conductive film comprising amorphous metal oxide is formed by an electron beam deposition method.

14. A method of reducing resistance for a conductive film formed on a base material according to claim 2, wherein the conductive film comprising amorphous metal oxide is formed by an ion plating method.

* * * * *